US010490689B1

(12) United States Patent
Terterian et al.

(10) Patent No.: US 10,490,689 B1
(45) Date of Patent: Nov. 26, 2019

(54) GRAIN BOUNDARY PASSIVATION OF POLYCRYSTALLINE MATERIALS

(71) Applicant: HRL Laboratories, LLC, Malibu, CA (US)

(72) Inventors: Sevag Terterian, Lake Balboa, CA (US); Terence J. DeLyon, Newbury Park, CA (US); Bor-An Clayton Tu, Thousand Oaks, CA (US); Hasan Sharifi, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/885,693

(22) Filed: Jan. 31, 2018

(51) Int. Cl.
*H01L 21/336* (2006.01)
*H01L 31/18* (2006.01)
*H01L 31/103* (2006.01)
*H01L 31/0368* (2006.01)

(52) U.S. Cl.
CPC ...... *H01L 31/1868* (2013.01); *H01L 31/0368* (2013.01); *H01L 31/1035* (2013.01); *H01L 31/1844* (2013.01)

(58) Field of Classification Search
None
See application file for complete search history.

(56) References Cited

U.S. PATENT DOCUMENTS

| 5,045,907 A | 9/1991 | Solomon |
| 5,534,445 A * | 7/1996 | Tran ................... H01L 21/3003 |
| | | 257/E21.212 |
| 6,194,722 B1 | 2/2001 | Fiorini et al. |
| 7,718,965 B1 | 5/2010 | Syllaios et al. |
| 2001/0055833 A1 | 12/2001 | Fiorini et al. |

OTHER PUBLICATIONS

Scheller, L. P., et al., Hydrogen passivation of polycrystalline silicon thin films, Journal of Applied Physics, 2012, pp. 063711-1-063711-8, 112, Published by American Institute of Physics 2012 copyright.
Einsele, Florian, et al., Analysis of sub-stoichiometric hydrogenated sillicon oxide films for surface passivation of crystalline silicon solar cells, Journal of Applied Physics, 2012, 054905-1-054905-8, 112, Published by American Institute of Physics 2012 copyright.

(Continued)

*Primary Examiner* — Long Pham
(74) *Attorney, Agent, or Firm* — North Shore Associates

(57) ABSTRACT

Methods of hydrogen atom incorporation and of passivation of grain boundaries of polycrystalline semiconductors use a low temperature, pulsed plasma to incorporate hydrogen atoms into the grain boundaries of polycrystalline semiconductor materials in a controlled manner. A hydrogen-passivated polycrystalline IR detector has hydrogen atoms incorporated into grain boundaries of a polycrystalline Group III-V compound semiconductor detector element and a dark current density characteristic that is lower than the dark current density characteristic of a polycrystalline IR detector without the incorporated hydrogen atoms.

18 Claims, 2 Drawing Sheets

(56) References Cited

OTHER PUBLICATIONS

Okamoto, Y., et al., Passivation of defects in nitrogen-doped polycrystalline Cu2O thin films by crown-ether cyanide treatment, Applied Physics Letters, Feb. 17, 2003, pp. 1060-1062, vol. 82, No. 7, Published by American Institute of Physics 2003 copyright.

Bruno, G., et al, Hydrogen plasma passivation of InP: Real time ellipsometry monitoring and ex situ photoluminescence measurements, Applied Physics Letters, Jul. 29, 1996, pp. 685-687, vol. 69, No. 5, American Institute of Physics 1996 copyright.

De Wolf, Stefan, et al., Nature of doped a-Si:H/c-Si interface recombination, Journal of Applied Physics, 2009, pp. 103707-1-103707-6, 105, American Institute of Physics 2009 copyright.

Ishizuka, S., et al., Hydrogen treatment for polycrystalline nitrogen-doped Cu2O thin film, Journal of Crystal Growth, 2002, pp. 616-620, 237-239, Elsevier Science B.V. 2002 copyright.

Dong, J. J., et al., Effects of Hydrogen Plasma Treatment on the Electrical and Optical Properties of ZnO Films: Identification of Hydrogen Donors in ZnO, ACS Applied Material Interfaces, 2010, pp. 1780-1784, 2 (6). Copyright 2010 American Chemical Society.

Bae, Wan Ki, et al., Highly Effective Surface Passivation of PbSe Quantum Dots through Reaction with Molecular Chlorine, Journal of the American Chemical Society, Nov. 2012, pp. 20160-20168, 134, copyright 2012 American Chemical Society.

Keuleyan, Sean, et al., Photoluminescence of Mid-Infrared HgTe Colloidal Quantum Dots, The Journal of Physical Chemistry C, 2014, pp. 2749-2753, 118, copyright 2014 American Chemical Society.

Norton, Paul R., Infrared image sensors, Optical Engineering, Nov. 1991, pp. 1649-1663, vol. 30, No. 11.

Sorianello, Vito, et al., Low-temperature germanium thin films on silicon, Optical Materials Express, Sep. 1, 2011, pp. 856-865, vol. 1, No. 5, copyright 2011 Optical Society of America.

Wang, Jianfei, et al., Resonant-cavity-enhanced mid-infrared photodetector on a silicon platform, Optics Express, Jun. 7, 2010, pp. 12890-12896, vol. 18, No. 12, copyright 2010 Optical Society of America.

Wang, Jianfei, et al., Spectral Selective Mid-Infrared Detector on a Silicon Platform, IEEE, 2009, pp. 235-237, copyright 2009 IEEE.

Singh, Vivek, et al., Mid-Infrared materials and devices on a Si platform for optical sensing, Science and Technology of Advanced Materials, 2014, 15 pages, vol. 15, 014603, copyright 2014 National Institute for Material Science.

Kasap, Safa, et al., "Amorphous and Polycrystalline Photoconductors for Direct Conversion Flat Panl X-Ray Image Sensors," Sensors, 2011, pp. 5112-5157, vol. 11.

Sprafke, Thomas and Beletic, James W., "High-Performance Infrared Focal Plane Arrays for Space Applicaitons," Optics and Photonics News (OPN), Jun. 2008, pp. 21-27, vol. 19, No. 6, Optical Society of America.

Rogalski, Antoni, Infrared detectors: an overview, Infrared Physics and Technology, 2002, pp. 187-210, vol. 43, copyright 2002 Elsevier Science B. V.

* cited by examiner

GRAIN BOUNDARY PASSIVATION OF POLYCRYSTALLINE MATERIALS

CROSS-REFERENCE TO RELATED APPLICATIONS

N/A

STATEMENT REGARDING FEDERALLY SPONSORED RESEARCH OR DEVELOPMENT

Not Applicable

BACKGROUND

1. Technical Field

The invention relates to polycrystalline semiconductor materials and methods to passivate grain boundaries. In particular, the invention relates to a plasma passivation technique using hydrogen atoms to alleviate impact of grain boundary defects in polycrystalline semiconductor devices.

2. Description of Related Art

Single-crystalline materials are preferred semiconductor materials in the electronics industry due to having minimal defects in their crystal structure. Having little or no crystal defects provides substantially unhindered electronic transport of charge carriers through the single-crystal structure. Electronic devices, such as photon detectors, benefit from the performance metrics associated with single-crystalline semiconductor materials. Moreover, high quality infrared (IR) detectors typically rely on the performance metrics of single-crystalline semiconductor materials for sensitive IR applications.

For example, IR detectors that use compound semiconductor materials are key components of focal plane arrays used in sensing and imaging applications in short-wave infrared (SWIR), medium-wave infrared (MWIR), and long-wave infrared (LWIR) spectral bands. The materials and processes used to fabricate IR detectors may impact performance metrics such as dark current density and spectral response, for example. IR detectors typically are fabricated using single-crystalline semiconductor materials to provide a level of sensitivity and performance in sensing and imaging applications in the above-mentioned spectral bands, for example for military applications. However, concomitant with performance and sensitivity is the cost to manufacture the single-crystalline IR detectors and the focal plane arrays that incorporate them for the specific applications.

Photon detectors used in photovoltaic applications have been fabricated and evaluated using polycrystalline semiconductor materials, in particular silicon-based photon detectors, for the manufacture of low-cost solar cells. Polycrystalline semiconductor materials are less expensive than their single-crystalline counterparts. However, polycrystalline semiconductor materials characteristically have crystal defects, such as vacancies, dislocations and grain boundaries. These crystal defects typically impact electronic transport of charge carriers through the polycrystalline material and result in lower sensitivity and performance metrics. Numerous techniques have been reported as means to passivate the grain boundaries of polycrystalline materials to improve electronic transport in photovoltaic applications. However, for these and other electronic devices, for example, IR detectors used in sensitive applications, e.g., IR focal plane arrays (FPAs), not only does incorporation of polycrystalline semiconductor materials present performance challenges, but also reducing the impact of the crystal defects in a polycrystalline electronic devices without damage to the underlying device structures has challenges. For example, many passivation techniques may require annealing at high temperature or other passivation steps that could damage or negatively impact underlying device structures.

In IR focal plane arrays (FPAs), the IR detectors are assembled to ROIC wafers, which are typically silicon-based wafers. FPA assembly has temperature and processing restrains that limit the ability to use and to passivated polycrystalline semiconductor materials, in particular for sensitive SWIR, MWIR and LWIR applications. While progress with passivation of polycrystalline photon detectors for photovoltaic applications has been made to improve performance in low-cost solar cell applications, a more versatile technique is still needed for electronic devices in other device applications. In particular, a technique to passivate grain boundaries in a polycrystalline electronic device, which may ameliorate performance metrics of the polycrystalline electronic device without causing damage to underlying circuitry and structures, is still needed. Such a technique may facilitate using polycrystalline semiconductor materials in electronic devices, such as IR detectors, e.g., for sensitive SWIR, MWIR and LWIR applications.

BRIEF SUMMARY

In some embodiments of the present invention, a method of incorporating hydrogen atoms into grain boundaries of a polycrystalline semiconductor material is provided. The method of incorporating hydrogen atoms comprises placing a polycrystalline semiconductor material into a vacuum chamber maintained at a temperature that is within a range of about 100° C. to less than 200° C. The method of incorporating hydrogen atoms further comprises forming a plasma comprising a mixture of hydrogen gas and a carrier gas in the vacuum chamber. The gas mixture has a ratio of gases that is within a range of about 0.1 parts hydrogen to about 10 parts carrier gas to about 1.0 parts hydrogen to about 10 parts carrier gas (i.e., ratio range of 'about 0.1:10 hydrogen:carrier gas' to 'about 1.0:10 hydrogen:carrier gas'). The method of incorporating hydrogen atoms further comprises exposing the polycrystalline semiconductor material to repeated pulses of the plasma for an exposure time within a range of about 15 minutes to about 240 minutes to incorporate the hydrogen atoms into the grain boundaries of the polycrystalline semiconductor material.

In other embodiments of the present invention, a method of passivating grain boundaries in a polycrystalline electronic device is provided. The method of passivating grain boundaries comprises placing an electronic device into a vacuum chamber maintained at a temperature that is within a range of about 100° C. to less than 200° C. The electronic device comprises a polycrystalline semiconductor device element layer on a substrate. The method of passivating grain boundaries further comprises pulsing a plasma that comprises hydrogen atoms into the vacuum chamber for a period of time within a range of about 15 minutes to about 240 minutes to passivate grain boundaries of the polycrystalline semiconductor device element layer with the hydrogen atoms in a controlled manner.

In some embodiments of the present invention, a hydrogen-passivated polycrystalline infrared (IR) detector is provided. The hydrogen-passivated polycrystalline IR detector comprises a detector element on a substrate, the detector element comprising a polycrystalline Group III-V compound semiconductor. The hydrogen-passivated polycrystalline IR detector further comprises hydrogen atoms incorporated into grain boundaries of the polycrystalline Group III-V compound semiconductor to passivate the grain boundaries. The hydrogen-passivated polycrystalline IR detector has a dark current density characteristic that is lower than the dark current density characteristic of a polycrystalline IR detector without the incorporated hydrogen atoms into the polycrystalline Group III-V compound semiconductor grain boundaries.

BRIEF DESCRIPTION OF THE DRAWINGS

Various features of embodiments in accordance with the principles described herein may be more readily understood with reference to the following detailed description taken in conjunction with the accompanying drawings, where like reference numerals designate like structural elements, and in which.

Figure 1:
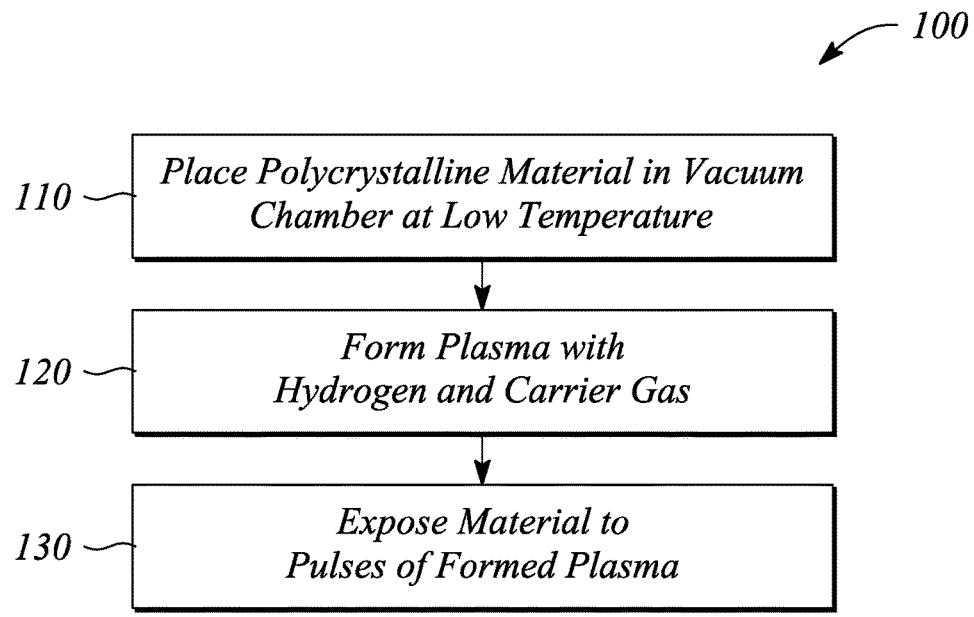
FIG. 1 illustrates a flow chart of a method of incorporating hydrogen atoms into grain boundaries of a polycrystalline semiconductor material in an example, according to an embodiment consistent with the principles of the present invention.

Certain examples and embodiments have other features that are one of in addition to and in lieu of the features illustrated in the above-referenced figures. These and other features are detailed below with reference to the above-referenced figures.

DETAILED DESCRIPTION

Embodiments of the present invention address difficulties with using polycrystalline semiconductor materials in electronic devices and provide a solution that includes passivating grain boundaries of the polycrystalline semiconductor materials to improve performance parameters of the polycrystalline electronic devices. In accordance with principles of the present invention described herein, methods of grain boundary passivation of polycrystalline materials with hydrogen atoms in a controlled manner and a hydrogen-passivated polycrystalline electronic device are provided.

In particular, embodiments consistent with the principles of the present invention described herein provide a low temperature, controlled plasma pulse process to passivate grain boundaries of a polycrystalline semiconductor material. The plasma comprises a carrier gas plasma and hydrogen atoms. The passivation methods described herein incorporate hydrogen atoms into grain boundaries at a temperature below about 200° C. with the use of a plasma source to aid in the incorporation process. Moreover, the passivation methods described herein provide the hydrogen atom incorporation in a controlled manner using a pulsing process. The passivation methods described herein in accordance with the present invention effectively passivate grain boundaries without introduction of damage to underlying materials, including structures and circuitry, and therefore, the passivation methods described herein readily render unnecessary any annealing steps. The low temperature, pulsed plasma passivation methods described herein may improve performance metrics for electronic devices fabricated using polycrystalline semiconductor materials.

Moreover, a hydrogen-passivated polycrystalline IR detector with improved performance metrics, in accordance with the principles described herein, is also described. Such polycrystalline IR detectors may be useful in the manufacture of focal plane arrays (FPA). For example, a polycrystalline IR detector may be fabricated directly on a readout integrated circuit (ROIC) silicon-based wafer using wafer-scale fabrication. In some embodiments, the polycrystalline IR detector may be fabricated in accordance with the methods described in a co-pending U.S. patent application Ser. No. 15/885,708, entitled "Fabrication of Polycrystalline Semiconductor Infrared Detector," which is filed the same day as the present application, and has the same Assignee. This co-pending application is incorporated by reference in its entirety herein.

For example, direct wafer-scale fabrication can reduce cost by eliminating time-consuming manufacturing steps (e.g., indium-bumping manual assembly of individual IR detector chips to ROIC chips). After direct fabrication, the polycrystalline IR detector/ROIC wafer assembly can be subjected to the low temperature, pulsed plasma passivation methods in accordance with the embodiments described herein to improve performance metrics of the polycrystalline IR detector portion of the assembly. The low temperature, pulsed plasma passivation methods described herein will not damage or negatively impact any underlying circuitry or structures of the ROIC. As such, the hydrogen-passivated polycrystalline IR detector and the passivation methods according to the present embodiments are compatible with wafer-scale IR focal plane array manufacture.

In some embodiments, the passivation methods and the hydrogen-passivated polycrystalline IR detector provide improved performance metrics, such as improved dark current density when compared to the polycrystalline IR detector before the hydrogen passivation in accordance with the present invention. As such, substantial manufacturing cost-savings relative to the conventional manufacturing of focal plane arrays using single-crystalline IR detectors without performance trade-offs may be realized.

As used herein, the article 'a' is intended to have its ordinary meaning in the patent arts, namely 'one or more'. For example, 'a material' means one or more materials and as such, 'the material' means 'the material(s)' herein. Also, any reference herein to 'top', 'bottom', 'upper', 'lower', 'up', 'down', 'front', 'back', 'left' or 'right' with respect to direction, or 'first' or 'second' with respect to priority, order or sequence, for example, is not intended to be a limitation herein. Herein, the term 'about' when applied to a value generally means within the tolerance range of the equipment used to produce the value, or may mean plus or minus 20%, or plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples and embodiments herein are intended to be illustrative only and are presented for discussion purposes and not by way of limitation.

According to some embodiments of the present invention, a method of incorporating hydrogen atoms into grain boundaries of a polycrystalline semiconductor material is provided. FIG. 1 illustrates a flow chart of a method 100 of incorporating hydrogen atoms into grain boundaries of a polycrystalline semiconductor material in an example, according to an embodiment consistent with the principles of the present invention.

The method 100 of incorporating hydrogen atoms into grain boundaries of a polycrystalline semiconductor material comprises placing 110 a polycrystalline semiconductor material into a vacuum chamber maintained at a temperature that is within a range of about 100° C. to less than 200° C. In some embodiments, the temperature is within the range of about 125° C. to about 190° C.; or about 130° C. to about 185° C.; or about 150° C. to about 185° C.; or about 150° C. to about 180° C. For example, the temperature of the vacuum chamber is maintained at about 175° C. Moreover, any vacuum chamber system that includes a plasma source and a pulsing capability may be used.

The method 100 of incorporating hydrogen atoms into grain boundaries of a polycrystalline semiconductor material further comprises forming 120 a plasma comprising a mixture of hydrogen gas and a carrier gas in the vacuum chamber. In particular, a plasma of the carrier gas is created and the hydrogen ($H_2$) gas is mixed into the carrier gas plasma. The carrier gas plasma breaks some of the $H_2$ gas into elemental hydrogen (H) or H atoms in the formed 120 plasma. The carrier gas includes, but is not limited to, any of the noble gases in Group VIII of the Period Table of the Elements, or a combination of two or more of the noble gases, for example. In some embodiments, the carrier gas is the noble gas argon. The gas mixture comprises a ratio of hydrogen gas to the carrier gas that may range from a ratio of about 0.1 parts hydrogen to about 10 parts carrier gas (i.e., 'about 0.1:10 hydrogen to carrier gas') to a ratio of about 1.0 parts hydrogen gas to about 10 parts carrier gas (i.e., 'about 1.0:10 hydrogen to carrier gas'), and includes any gas ratio within that range.

Examples of the gas ratio that may be used in forming 120 a plasma according to the method 100 of incorporating hydrogen atoms include a gas ratio within the range of about 0.2:10 hydrogen to carrier gas to about 1.0:10 hydrogen to carrier gas; or within the range of about 0.4:10 hydrogen to carrier gas to about 1.0:10 hydrogen to carrier gas; or within the range of about 0.6:10 hydrogen to carrier gas to about 1.0:10 hydrogen to carrier gas; or within the range of about 0.8:10 hydrogen to carrier gas to about 1.0:10 hydrogen to carrier gas. For example, the ratio of hydrogen gas to the carrier gas may be about 1.0:10 hydrogen to carrier, for example, about 1:10 hydrogen to argon.

The method 100 of incorporating hydrogen atoms into grain boundaries of a polycrystalline semiconductor material further comprises exposing 140 the polycrystalline semiconductor material to pulses of the formed 120 plasma for an exposure time within a range of about 15 minutes to about 240 minutes to incorporate the hydrogen atoms into the grain boundaries of the polycrystalline semiconductor material. Characteristics of the pulsed exposure 140, for example, during the exposure time (i.e., a time period of the pulsed exposure 140), provide control over hydrogen atom incorporation. In some embodiments, the pulsed exposure 140 comprises both controlling an amount of the hydrogen atoms that are incorporated into the grain boundaries and tuning an incorporation rate of the hydrogen atoms into the grain boundaries, using characteristics of the plasma pulse.

The characteristics of the plasma pulse comprise one or more of a quantity of the pulses, a pulse duration, a rest period between the pulses, and a pulse power, for example, during the time period of the pulsed exposure 140. Further, a combination of gas flows of the hydrogen gas and the carrier gas in the formed 120 plasma gas mixture further facilitate incorporation of the hydrogen atoms into the grain boundaries. For example, the gas flow of the hydrogen gas is a fraction of the gas flows of the carrier gas and the carrier gas plasma. In an embodiment, the gas flow of the carrier gas may be about thirty times, and the gas flow of the carrier gas plasma may be about eighty times, more than the gas flow of the hydrogen gas in the formed 120 plasma gas mixture. In some embodiments, exposing 140 the polycrystalline semiconductor material to pulses of the plasma comprises using the plasma pulse duration and the rest period between the plasma pulses to control the amount of the hydrogen atoms incorporated into the grain boundaries and to tune the incorporation rate of the hydrogen atoms into the grain boundaries.

In some embodiments, during the pulsed exposure 140, the plasma pulse duration may be within a range of about 5 seconds to about 20 seconds. Other examples of the pulse duration include the range of within about 5 seconds to about 15 seconds; or about 5 seconds to about 12 seconds; or about 7 seconds to about 20 seconds; or about 7 seconds to about 15 seconds; or about 8 seconds to about 12 seconds. In some embodiments, the pulse duration is about 10 seconds, for example.

In some embodiments, the rest period between the plasma pulses during the pulsed exposure 140 may be within a range of about 2 seconds to about 12 seconds. Other examples of the rest period between the plasma pulses include the range of within about 2 seconds to about 10 seconds; or about 2 seconds to about 8 seconds; or about 2 seconds to about 6 seconds. In some embodiments, the rest time between pulses is about 5 seconds, for example. A pulse cycle is defined as the duration of a single pulse and the rest time immediately following the single pulse. As such, a pulse cycle may be within a range of about 7 seconds to about 32 seconds, for example.

In some embodiments, the plasma pulse power during the pulsed exposure 140 may be within a range of about 20 Watts to about 300 Watts, for example and not by way of limitation. In some embodiments, the pulse power may be about 200 Watts, for example.

Moreover, the time period or 'an exposure time' of the pulsed exposure 140 may be within a range of about 15 minutes to about 210 minutes in some embodiments. In some examples, the exposure time is within the range of about 15 minutes to about 180 minutes; or about 15 minutes to about 150 minutes; or about 15 minutes to about 120 minutes; or about 15 minutes to about 90 minutes. In other examples, the exposure time is within the range of about 15 minutes to about 60 minutes; or about 15 minutes to about 30 minutes. In some embodiments, the exposure time may be about 1 hour to about 2 hours, for example.

In an embodiment, the plasma pulse characteristics during the pulse exposure 140 may comprise a plasma pulse duration within a range of about 5 seconds to about 20 seconds, a rest time between the plasma pulses within a range of about 2 seconds to about 10 seconds at a pulse power within a range of about 20 Watts to about 300 Watts. In another embodiment, the plasma pulse characteristics during the pulse exposure 140 may comprise a plasma pulse duration of about 5 seconds to about 15 seconds at a pulse power within a range of about 20 Watts to about 300 Watts, and a rest time of about 2 seconds to about 8 seconds between plasma pulses for the exposure time within the range of about 15 minutes to about 180 minutes. In some embodiments, the plasma pulse characteristics during the pulse exposure 140 comprise a pulse duration of about 10 seconds, a rest time between pulses of about 5 seconds, and a number of pulses that is within a range of about 50 pulses to about 1000 pulses.

In some embodiments of the method 100 of incorporating hydrogen atoms, the polycrystalline semiconductor material is a Group III-V compound semiconductor material that comprises one or more elements from Group III alloyed with one or more elements from Group V of the Periodic Table of the Elements. Examples of the Group III-V compound semiconductor material include one or more of indium (In), aluminum (Al) and gallium (Ga) from Group III with one or more of phosphorous (P), arsenic (As) and antimony (Sb) from Group V. In some embodiments, the Group III-V compound semiconductor material includes one or more of In, Ga and Al and one or more of P, As and Sb.

In some embodiments, the semiconductor material may be a polycrystalline device element layer of an electronic device (i.e., 'a polycrystalline electronic device'). By 'device element,' it is meant one or both of active and passive semiconductor material structures that contribute to the function of the electronic device. By 'polycrystalline electronic device' it is meant an electronic device comprising a polycrystalline semiconductor device element layer. The polycrystalline electronic device may be fabricated using any methods of semiconductor device fabrication. Moreover, the methods of grain boundary passivation with hydrogen atoms in accordance with the present invention may be applicable to any polycrystalline electronic device or device fabrication method.

In some embodiments, the polycrystalline electronic device that is passivated in accordance with the present invention includes, but is not limited to, a polycrystalline IR detector, for example an IR detector that comprises a polycrystalline semiconductor device element layer (hereinafter, also may be referred to as 'detector element layer'). The polycrystalline semiconductor detector element layer may comprise a Group III-V compound semiconductor that includes, but is not limited to, In and As. For example, the polycrystalline device element layer of the IR detector may comprise one or more of InAs, AlSb, InSb, InGaAs, or InAsSb, and for example, the IR detector may be an InAsSb MWIR detector or an InAs MWIR detector.

In some embodiments, after incorporation of hydrogen atoms according to the method 100 of incorporating, the IR detector has a dark current density characteristic that is lower than the dark current density characteristic of the IR detector before the incorporation of hydrogen atoms according to the method 100. For example, the dark current density characteristic may be reduced by a factor within a range of about 2 to about 15 after the method 100 of incorporating. In some embodiments, after the incorporation method 100, the dark current density characteristic of the IR detector is about 5 times lower to about 12 times lower than the dark current density characteristic the IR detector before the incorporation of hydrogen atoms according the incorporation method 100.

In particular, the method 100 of incorporating hydrogen atoms in accordance with the embodiments described herein is compatible with polycrystalline IR detector structures including, but not limited to, those fabricated directly on a ROIC wafer (i.e., 'IR detector/ROIC wafer') for wafer-scale manufacturing of FPAs, as referenced above. For example, the low temperature (i.e., the range of about 100° C. to less than 200° C.) of the vacuum chamber in which the polycrystalline IR detector/ROIC wafer is placed 110 and the pulsed plasma exposure 140 of the method 100 of incorporating hydrogen atoms do not degrade, and do not introduce damage to, underlying materials, such as any sensitive components (e.g., circuitry) of the IR detector/ROIC wafer. In some embodiments, an indication that damage is not introduced by the method 100 herein is the above-referenced lower dark current density characteristic that may be achieved. Therefore, no annealing steps are needed or required in accordance with the method 100 of incorporating hydrogen atoms to passivate grain boundaries in the polycrystalline semiconductor material. At the same time, these features of the method 100 of incorporating hydrogen atoms to passivate grain boundaries do provide an improvement in performance metrics of the polycrystalline IR detector fabricated on the ROIC wafer. As such, the method 100 of incorporating hydrogen atoms is particularly compatible with wafer-scale manufacturing of IR FPAs using polycrystalline semiconductor materials.

Figure 2:
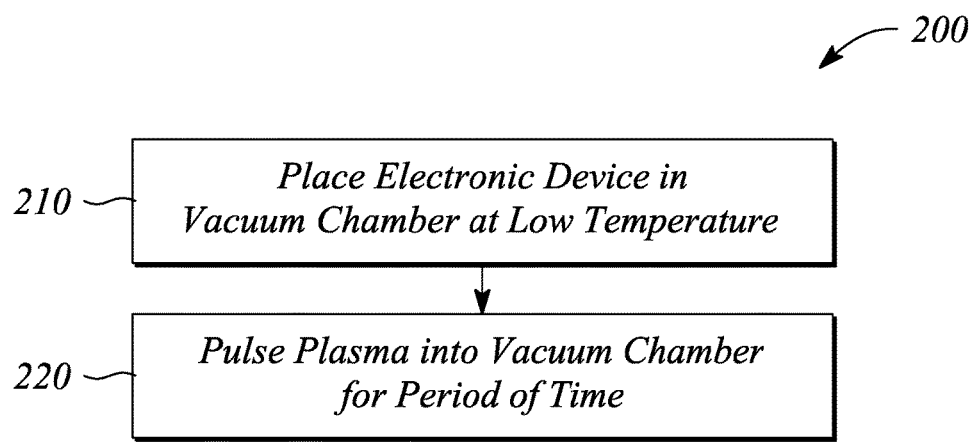
FIG. 2 illustrates a flow chart of a method of passivating grain boundaries in a polycrystalline electronic device in an example, according to an embodiment consistent with the principles of the present invention.

In some embodiments of the present invention, a method of passivating grain boundaries in a polycrystalline electronic device is provided. FIG. 2 illustrates a flow chart of a method 200 of passivating grain boundaries in a polycrystalline electronic device in an example, according to an embodiment consistent with the principles of the present invention. The method 200 of passivating grain boundaries comprises placing 210 the polycrystalline electronic device into a vacuum chamber maintained at a temperature that is within a range of about 100° C. to less than about 200° C. In some embodiments, the temperature that the vacuum chamber is maintained is substantially similar to being within any of the ranges of the temperature described above for the method 100 of incorporating hydrogen atoms. For example, the vacuum chamber may be maintained within the range of about 150° C. to about 180° C. in some embodiments of the method 200 of passivating grain boundaries.

In some embodiments, the polycrystalline electronic device in which the grain boundaries are passivated in accordance with the method 200 comprises a polycrystalline Group III-V compound semiconductor device element layer on a substrate. The polycrystalline Group III-V compound semiconductor device element layer comprises any of the Group III-V compound semiconductor materials listed above with respect to the method 100 of incorporating hydrogen atoms into a semiconductor material. Moreover, the substrate of the polycrystalline electronic device may be an amorphous template or a substrate or semiconductor wafer having an amorphous surface (i.e., a non-crystalline surface or a polycrystalline surface, for example). In some embodiments, the polycrystalline electronic device is an IR detector comprising a polycrystalline Group III-V compound semiconductor detector element layer on a substrate, for example a wafer with an oxidized surface. For example, the substrate may be a ROIC wafer. In some embodiments, the polycrystalline IR detector is fabricated directly on a ROIC wafer (i.e., 'IR detector/ROIC wafer') using wafer-scale manufacturing, for example as described in the above-incorporated by reference, co-pending U. S. patent application.

The method 200 of passivating grain boundaries further comprises pulsing 220 a plasma comprising hydrogen atoms into the vacuum chamber for a period of time to passivate grain boundaries of the polycrystalline semiconductor device element layer with hydrogen atoms in a controlled manner. In some embodiments, the period of time of pulsing 220 is within a range of about 15 minutes to about 240 minutes. In some embodiments, the period of time of pulsing 220 according to the method 200 of passivating is substantially similar to being within any of the ranges described above for the exposure time of the method 100 of incorporating hydrogen atoms. For example, the period of time of pulsing 220 may be within the range of about 15 minutes to about 180 minutes; or within the range of about 15 minutes to about 120 minutes.

In some embodiments of the method 200 of passivating grain boundaries, pulsing 220 a plasma comprises forming a gas plasma of a carrier gas and mixing hydrogen gas into the carrier gas plasma. The hydrogen gas is flowed through the formed carrier gas plasma. The carrier gas plasma breaks some of the hydrogen ($H_2$) gas into elemental hydrogen (H) or H atoms and the H atoms are carried to the polycrystalline semiconductor device element layer by the carrier gas for incorporation into the grain boundaries of the element layer. A combination of gas flows of the hydrogen gas and the carrier gas in the carrier gas plasma may facilitate incorporation of the hydrogen atoms into the grain boundaries.

In some embodiments, hydrogen gas is mixed into the carrier gas in a ratio of hydrogen to carrier gas that is within a range of about 0.1 parts hydrogen to about 10 parts carrier gas (i.e., ratio of 'about 0.1:10 hydrogen to carrier gas') to about 1.0 parts hydrogen to about 10 parts carrier gas (i.e., ratio of 'about 1.0:10 hydrogen to carrier gas'). In some embodiments, the range of the ratio of hydrogen gas to carrier gas according to the method 200 of passivating is substantially similar to being within any of the ranges the described above for the hydrogen to carrier gas ratio of the method 100 of incorporating hydrogen atoms. For example, the gas ratio may be within the range of about 0.5:10 hydrogen to carrier gas to about 1.0:10 hydrogen to carrier gas. In another example, the gas ratio may be within the range of about 0.8:10 hydrogen to carrier gas to about 1.0:10 hydrogen to carrier gas. Moreover, the plasma may comprise hydrogen gas mixed with a noble gas as the carrier gas, for example argon gas.

Moreover, pulsing 220 a plasma further comprises exposing the polycrystalline electronic device to pulse characteristics that control incorporation of the hydrogen atoms into the polycrystalline grain boundaries. The pulse characteristics comprise one or more of a plasma pulse duration, a rest time between plasma pulses, a pulse cycle, and a pulse power, for example. In some embodiments, the plasma pulse duration is substantially similar to being within any of the ranges described above for the pulse duration in accordance with the method 100 of incorporating hydrogen atoms. For example, the plasma pulse duration may be within the range of about 5 seconds to about 15 seconds, or about 7 seconds to about 15 seconds, in some embodiments of pulsing 220.

Moreover, in some embodiments of pulsing 220 a plasma, the rest time between plasma pulses is substantially similar to being within any of the ranges described above for the rest time between plasma pulses in accordance with the method 100 of incorporating hydrogen atoms. For example, the rest time between plasma pulses may be within the range of about 2 seconds to about 8 seconds, or about 2 seconds to about 10 seconds, or about 2 seconds to about 12 seconds, in some embodiments of pulsing 220. Further, in some embodiments, the pulse power is substantially similar to being within any of the ranges described above for the pulse power in accordance with the method 100 of incorporating hydrogen atoms. For example, the pulse power may be within the range of about 20 Watts to about 300 Watts. The pulse cycle is also as defined above for the method 100, for example.

In some embodiments of the method 200 of passivating, the pulse characteristics of the plasma pulsing 220 comprise a plasma pulse duration of about 5 seconds to about 15 seconds and a rest time of about 2 seconds to about 8 seconds between plasma pulses for the period of time of the pulsing 220. In other embodiments of the method 200 of passivating, the plasma pulsing 220 comprises using a pulse duration within a range of about 5 seconds to about 15 seconds at a pulse power within a range of about 20 Watts to about 300 Watts, and a rest time within a range of about 2 seconds to about 12 seconds between pulses for the pulsing period of time within the range of about 15 minutes to about 180 minutes to control an incorporation rate and an incorporation efficiency of hydrogen atoms into the grain boundaries. In another embodiment of the method 200 of passivating, the plasma pulsing 220 comprises using a pulse duration within a range of about 7 seconds to about 15 seconds and a rest time within a range of about 2 seconds to about 10 seconds between pulses for the period of time within the range of about 15 minutes to about 120 minutes.

In some embodiments, the polycrystalline electronic device is a polycrystalline IR detector that, after passivating grain boundaries according to the method 200, has a dark current density characteristic that is lower than the polycrystalline IR detector before passivating the grain boundaries according to the method 200. In some embodiments, the dark current density characteristic is reduced by a factor that is substantially similar to the reduction factor described above for the lower dark current density characteristic according to the method 100 of incorporating hydrogen atoms. As such, the method 200 of passivating grain boundaries in a polycrystalline electronic device is suited for improving performance metrics of a polycrystalline IR detector, and the polycrystalline IR detector passivated, as described herein, may be suited for wafer-scale manufacturing of IR FPAs at a lower cost than chip-scale manufacturing of IR FPAs using single-crystalline IR detectors.

Figure 3:
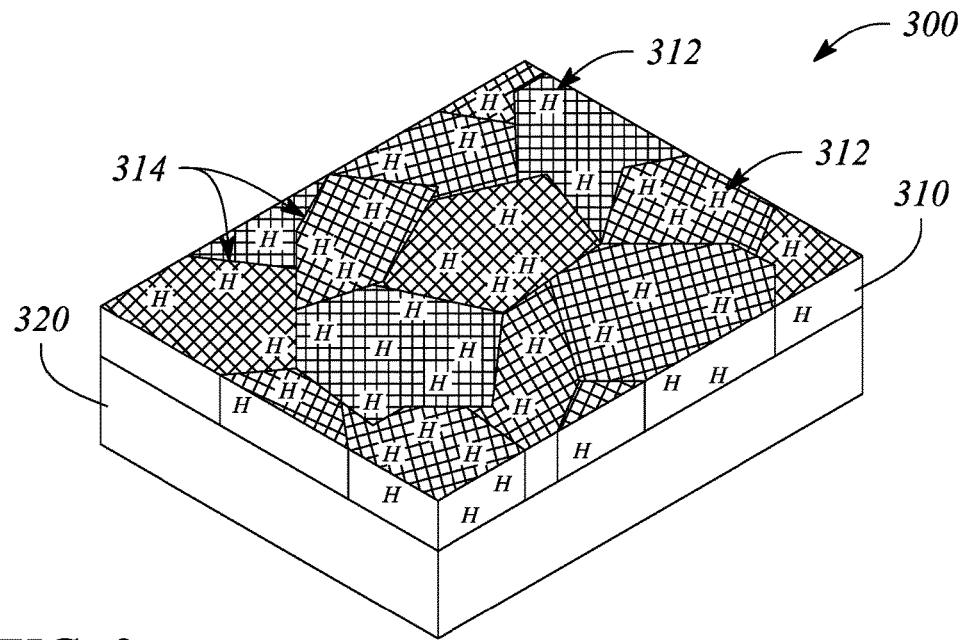
FIG. 3 illustrates a perspective view of a hydrogen-passivated polycrystalline infrared (IR) detector in an example, according to an embodiment consistent with the principles of the present invention.

In some embodiments of the present invention, a hydrogen-passivated polycrystalline IR detector is provided. FIG. 3 illustrates a perspective view of a hydrogen-passivated polycrystalline IR detector 300 in an example in accordance with the principles described herein. The hydrogen-passivated polycrystalline IR detector 300 comprises a detector element 310 on a substrate 320. The detector element 310 comprises a polycrystalline Group III-V compound semiconductor with a semiconductor junction. In some embodiments, the polycrystalline Group III-V compound semiconductor is substantially similar to any of the Group III-V compound semiconductor materials listed above with respect to the method 100 of incorporating hydrogen atoms. For example, the polycrystalline Group III-V compound semiconductor of the detector element 310 comprises one or both of InAs and InAsSb. The semiconductor junction may be a p-n junction formed from doping the polycrystalline Group III-V compound semiconductor of the detector element 310. The substrate 320 includes, but is not limited to, a ceramic support, a glass support, a semiconductor wafer, or a metal support, for example. In some embodiments, the substrate 320 has an amorphous surface that is in direct physical contact with the polycrystalline semiconductor materials of the IR detector. In some embodiments, the polycrystalline IR detector is fabricated using the methods described in the above incorporated by reference, co-pending U.S. patent application.

The hydrogen-passivated polycrystalline IR detector 300 further comprises hydrogen (H) atoms 312 incorporated into grain boundaries 314 of the polycrystalline Group III-V compound semiconductor to passivate the grain boundaries 314. Grain boundaries in polycrystalline structures have imperfections that are believed to hinder electron transport through the polycrystalline material. For example, the polycrystalline imperfections may give rise to local fields, short circuit channels for current flow, and recombination centers, any of which detrimentally affect detector performance. The imperfections have been reported to include, not by limitation herein, one or more of atoms with dangling bonds, extra bonds, and wrong bonds in the grain boundaries (see, for example, L-P. Scheller, et al., "Hydrogen passivation of polycrystalline silicon thin films," *Journal of Applied Physics*, 112, 063711 (2012)).

In some examples of the hydrogen-passivated polycrystalline IR detector 300, the incorporated hydrogen atoms 312 may neutralize the so-called dangling bonds and extra bonds in the grain boundaries to render these imperfections as benign and further, to facilitate unhindered movement of electrons, e.g., photo-generated electrons, across the grain boundaries. For example, the hydrogen atoms may combine with various semiconductor atoms (e.g., In, As, Sb, etc.) in the polycrystalline structure that may have dangling bonds, such as those bonds found in grain boundaries or on surfaces. The hydrogen atom may combine with a dangling bond so that the dangling bond does not trap a photo carrier electron. As such, the hydrogen atom annihilates, for example, the negative impact that the dangling bond has on electron transfer.

The hydrogen-passivated polycrystalline IR detector 300 further comprises a dark current density characteristic that is lower than the dark current density characteristic of a polycrystalline IR detector without the incorporated hydrogen atoms into the polycrystalline Group III-V compound semiconductor grain boundaries. In particular, a polycrystalline Group III-V compound semiconductor IR detector without hydrogen atoms incorporated into grain boundaries has a higher dark current density characteristic than the same polycrystalline IR detector that comprises hydrogen atoms incorporated into grain boundaries, as in the hydrogen-passivated polycrystalline IR detector 300.

Dark current density measurements for an example polycrystalline IR detector structure before and after hydrogen passivation in accordance with the embodiments of the methods 100, 200 described herein are further described below with respect to the Example. In the Example, the polycrystalline detector structure was fabricated on a substrate with an amorphous surface using the method described in the above-referenced, co-pending U.S. patent application, although the present invention described herein is not limited to the polycrystalline materials or the fabrication method used in the Example.

EXAMPLE

A polycrystalline InAs single element detector having a device size of 200 micrometers was measured for dark current density characteristic over a reverse bias voltage ranging from −1.0 Volts to 0.2 Volts. The polycrystalline InAs single element detector was then placed on a heated platen at 175° C. in a vacuum chamber. The vacuum chamber used was a Cambridge Fiji Atomic Layer Deposition system (Veeco/CNT, Waltham, Mass.). Hydrogen gas was introduced into an argon (Ar) gas formed in the vacuum chamber. The polycrystalline InAs single element detector was exposed to hydrogen atoms in argon gas plasma in small doses using a pulsing action.

Table 1 describes the process flow and parameters of the pulse action exposure used to avoid any damage to the polycrystalline InAs single element material. A ratio of about 1:10 hydrogen to argon carrier gas was maintained during the exposure to the pulse action. With reference to the process flow provided in Table 1, an Ar carrier gas flow was set to 30 SCCM and an Ar plasma flow was set to 80 SCCM. The $H_2$ gas valve was opened and the $H_2$ flow was set at 1 SCCM. After 10 seconds, the polycrystalline InAs single element detector in the vacuum chamber was subjected to a first plasma pulse (steps 6-9) of the 1:10 gas mixture of $H_2$:Ar, and then subjected to 120 repeat cycles of the plasma pulse, wherein each pulse ran for 10 seconds at 200 Watts of power and the pulses were separated by rest periods of 5 seconds each between the pulses. Both steps 8 and 9 in Table 1 represent the rest period, wherein the plasma is turned off (i.e., the pulse power is set to 0 Watts) for 5 seconds. After the 120 repeat pulse cycles (total about 30 minutes), the $H_2$ valve was closed, and then the Ar carrier flow and Ar plasma flow were reduced to 20 SCCM and 40 SCCM, respectively, and the process was terminated.

TABLE 1

Parameters used for incorporation of hydrogen atoms in the polycrystalline InAs single element detector device. SCCM is Standard Cubic Centimeters per Minute. MFC is mass flow controller.

| Process Step No. | Process Parameter | Flow Rate | Time/ Cycles | Power | Units |
|---|---|---|---|---|---|
| 1 | Flow carrier (Ar) | 30 | | | SCCM |
| 2 | Flow plasma (Ar) | 80 | | | SCCM |
| 3 | MFC Valve ($H_2$) - Open | | | | |
| 4 | Flow ($H_2$) | 1 | | | SCCM |
| 5 | Wait time | | 10 | | Seconds |
| 6 | Plasma Power | | | 200 | Watts |
| 7 | Pulse time | | 10 | | Seconds |
| 8 | Plasma Power | | | 0 | Watts |
| 9 | Rest time | | 5 | | Seconds |
| 10 | Repeat Steps 6-9 | | 120 | | Repeat Cycles |
| 11 | MFC Valve ($H_2$) - Close | | | | |
| 12 | Flow carrier (Ar) | 20 | | | SCCM |
| 13 | Flow plasma (Ar) | 40 | | | SCCM |

The dark current density characteristic of the hydrogen-passivated polycrystalline InAs single element detector was measured again over the same reverse bias voltage from −1.0 Volts to 0.2 Volts. By turning off the plasma exposure during the rest periods, the semiconductor material is not exposed to any ionized atoms, such as $H^+$ or $Ar^+$, and the semiconductor material can undergo a period where there is time for the hydrogen atoms to move into the grain boundaries and combine with, or annihilate, dangling bonds, for example. The rest periods may be thought of as built-in annealing periods between pulses, because the semiconductor material is undergoing a change in its crystal structure to some degree (e.g., H atoms impact on dangling bonds) during the rest periods. Moreover, the rest periods between plasma pulses described herein allow semiconductor materials to anneal themselves at the elevated temperature of the vacuum chamber.

Figure 4:
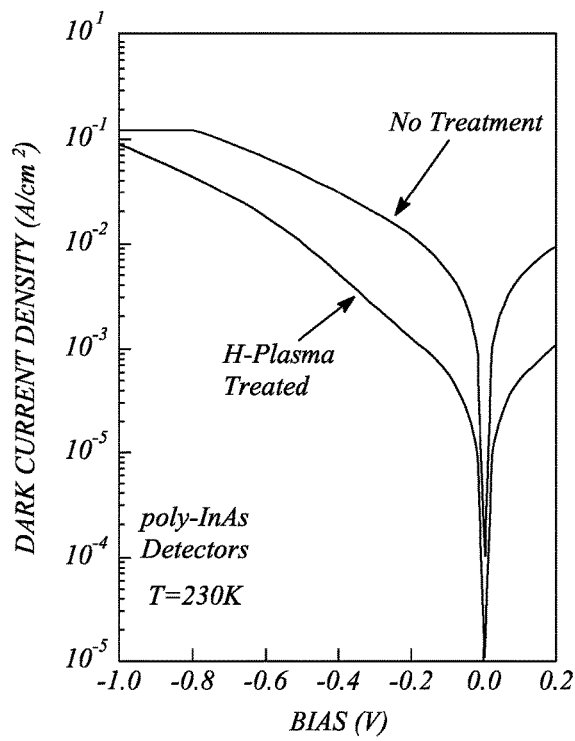
FIG. 4 illustrates a graph of a dark current density characteristic of an example polycrystalline InAs barrier detector structure in an example before and after passivation according to the method of FIG. 2, according to an embodiment consistent with the principles of the present invention.

FIG. 4 illustrates a graph of dark current density versus reverse bias measured for the polycrystalline InAs single element detector example before and after passivation according to the method 200 of FIG. 2 in an example, according to an embodiment consistent with the principles of the present invention. The dark current density is in units of Amps per square centimeter (A/cm$^2$) and the reverse bias is in voltage (V). The temperature was 230 Kelvin (K). The dark current density measurements on the polycrystalline InAs single element detector example were made using an Agilent B1500 Semiconductor Device Analyzer (Keysight Technologies, CA).

From the graph in FIG. 4, the dark current density of the polycrystalline InAs single element detector example after the hydrogen passivation is lower than before hydrogen passivation throughout the reverse bias range of −1.0 V to 0.2 V. Moreover, at 0.0 V reverse bias voltage, the dark current density of the detector device example after hydrogen passivation was about $10^{-5}$ A/cm$^2$ and was about $10^{-4}$ A/cm$^2$ before hydrogen passivation, which was a ten-fold improvement (i.e., reduction) in dark current density due to the hydrogen passivation. Moreover, at −0.2 V, the dark current density of the polycrystalline InAs single element detector example was about $3 \times 10^{-2}$ A/cm$^2$ after hydrogen passivation and about $3 \times 10^{-1}$ A/cm$^2$ before hydrogen passivation, also about a ten-fold improvement.

The parameters reported in Table 1 represent an example of the parameters to achieve a reduced dark current density, and is not a limitation herein. Other parameters may be used to provide the pulsed plasma incorporation of hydrogen atoms into the grain boundaries to achieve reduced dark current density and still be within the scope of the present invention. Moreover, the methods 100, 200 and the detector 300 described herein may provide electronic devices having polycrystalline semiconductor device element layers with improved performance characteristics. Moreover, the methods 100, 200 and the detector 300 described herein enable polycrystalline Group III-V compound semiconductor materials to be used in IR detector fabrication and in wafer-scale fabrication thereof on ROIC wafers for IR FPAs without damage. Performance metrics, in particular dark current density, of a polycrystalline IR detector are improved by the hydrogen-passivated methods 100, 200 described herein. Concomitantly, the conventional costs associated with using single-crystalline materials for IR detectors and chip-scale assembly thereof to ROIC wafers for FPA manufacture may be avoided.

Thus, there have been described examples of methods of grain boundary passivation of polycrystalline semiconductors with hydrogen atoms in a low temperature, controlled manner using a pulsed plasma, and a hydrogen-passivated polycrystalline IR detector with improved dark current density. It should be understood that the above-described embodiments and examples are merely illustrative of some of the many specific examples and embodiments that represent the principles consistent with the principles described herein. Clearly, those skilled in the art can readily devise numerous other arrangements without departing from the scope consistent with the principles described herein as defined by the following claims.

What is claimed is:

1. A method of incorporating hydrogen atoms into grain boundaries of a polycrystalline semiconductor material, the method comprising:
   placing a polycrystalline semiconductor material into a vacuum chamber maintained at a temperature that is within a range of about 100° C. to less than 200° C.;
   forming a plasma comprising a mixture of hydrogen gas and a carrier gas in the vacuum chamber, the mixture having a ratio of gases that is within a range of about 0.1:10 hydrogen to carrier gas to about 1.0:10 hydrogen to carrier gas; and
   exposing the polycrystalline semiconductor material to pulses of the plasma for an exposure time within a range of about 15 minutes to about 240 minutes to incorporate the hydrogen atoms into the grain boundaries of the polycrystalline semiconductor material.

2. The method of incorporating hydrogen atoms into grain boundaries of claim 1, wherein exposing the polycrystalline semiconductor material to pulses of the plasma comprises controlling an amount of the hydrogen atoms incorporated into the grain boundaries and tuning an incorporation rate of the hydrogen atoms into the grain boundaries with characteristics of the plasma pulses.

3. The method of incorporating hydrogen atoms into grain boundaries of claim 2, wherein the characteristics of the plasma pulses comprise one or more of a quantity of the pulses, a pulse duration, a rest period between the pulses, and a pulse power.

4. The method of incorporating hydrogen atoms into grain boundaries of claim 1, wherein exposing the polycrystalline semiconductor material to pulses of the plasma comprises using a repeated pulse cycle comprising a plasma pulse duration and a rest period between the plasma pulses during the exposure time to control an amount of the hydrogen atoms incorporated into the grain boundaries and to tune an incorporation rate of the hydrogen atoms into the grain boundaries.

5. The method of incorporating hydrogen atoms into grain boundaries of claim 1, wherein exposing the polycrystalline semiconductor material to pulses of the plasma comprises using a plasma pulse duration within a range of about 5 seconds to about 20 seconds, a rest time between the plasma pulses within a range of about 2 seconds to about 10 seconds, and a pulse power within a range of about 20 Watts to about 300 Watts.

6. The method of incorporating hydrogen atoms into grain boundaries of claim 1, wherein the ratio of gases is within the range of about 0.5:10 hydrogen to carrier gas to about 1.0:10 hydrogen to carrier gas, the pulses of plasma comprising a plasma pulse duration of about 5 seconds to about 15 seconds, a pulse power within a range of about 20 Watts to about 300 Watts, and a rest time within a range of about 2 seconds to about 8 seconds between plasma pulses.

7. The method of incorporating hydrogen atoms into grain boundaries of claim 6, wherein the temperature is within the range of about 125° C. to about 190° C., the exposure time being within the range of about 15 minutes to about 180 minutes.

8. The method of incorporating hydrogen atoms into grain boundaries of claim 6, wherein the temperature is within the range of about 150° C. to about 190° C. the exposure time is about 15 minutes to about 120 minutes.

9. The method of incorporating hydrogen atoms into grain boundaries of claim 1, wherein the pulses of plasma comprise a plasma pulse duration of about 5 seconds to about 15 seconds, a pulse power within a range of about 20 Watts to about 300 Watts, and a rest time within a range of about 2 seconds to about 8 seconds between plasma pulses, the exposure time being within the range of about 15 minutes to about 60 minutes.

10. The method of incorporating hydrogen atoms into grain boundaries of claim 9, wherein the temperature is within the range of about 150° C. to about 185° C.

11. The method of incorporating hydrogen atoms into grain boundaries of claim 1, wherein the carrier gas is argon, the ratio of gases being about 1 hydrogen to about 10 argon, the temperature being about 175° C., the polycrystalline semiconductor material comprising a Group III-V compound semiconductor material, and wherein exposing the polycrystalline semiconductor material to pulses of the plasma comprises a number of pulse cycles within a range of about 50 to about 1000, the pulse cycles comprising a pulse duration of about 10 seconds and a rest time between pulses of about 5 seconds.

12. The method of incorporating hydrogen atoms into grain boundaries of claim 11, wherein the polycrystalline Group III-V compound semiconductor material comprises indium and arsenic.

13. The method of incorporating hydrogen atoms into grain boundaries of claim 11, wherein the polycrystalline Group III-V compound semiconductor material comprises indium arsenide (InAs), the polycrystalline InAs material is a device layer of an infrared (IR) detector, and wherein the IR detector after incorporation of hydrogen atoms has a dark current density characteristic that is about 5 times to about 12 times lower than the dark current density characteristic the IR detector before the incorporation of hydrogen atoms.

14. A method of passivating grain boundaries in a polycrystalline electronic device, the method comprising:

placing an electronic device into a vacuum chamber maintained at a temperature that is within a range of about 100° C. to less than about 200° C., the electronic device comprising a polycrystalline semiconductor device element layer; and pulsing a plasma that comprises hydrogen atoms into the vacuum chamber for a period of time within a range of about 15 minutes to about 240 minutes to passivate grain boundaries of the polycrystalline semiconductor device element layer with the hydrogen atoms in a controlled manner.

15. The method of passivating grain boundaries in a polycrystalline electronic device of claim 14, wherein pulsing a plasma comprises:

forming a gas plasma of a carrier gas;

mixing hydrogen gas into the carrier gas plasma, the hydrogen gas and a carrier gas are mixed in a ratio of hydrogen to carrier gas that is within a range of about 0.1:10 hydrogen to carrier gas to about 1.0:10 hydrogen to carrier gas; and exposing the electronic device to pulse characteristics that control incorporation of the hydrogen atoms into the polycrystalline grain boundaries.

16. The method of passivating grain boundaries in a polycrystalline electronic device of claim 15, wherein the pulse characteristics comprise a plasma pulse duration within a range of about 5 seconds to about 15 seconds, and a rest time between plasma pulses within a range of about 2 seconds to about 8 seconds for the period of time of pulsing.

17. The method of passivating grain boundaries in a polycrystalline electronic device of claim 14, wherein pulsing a plasma comprises using a pulse duration within a range of about 5 seconds to about 15 seconds, a pulse power within a range of about 20 Watts to about 300 Watts, and a rest time within a range of about 2 seconds to about 12 seconds between pulses for the period of time within the range of about 15 minutes to about 180 minutes to control an incorporation rate and an incorporation efficiency of hydrogen atoms into the grain boundaries, and wherein the plasma comprises hydrogen gas mixed with argon as the carrier gas in a ratio within a range of about 0.5:10 hydrogen to argon to about 1.0:10 hydrogen to argon.

18. The method of passivating grain boundaries in a polycrystalline electronic device of claim 14, wherein the electronic device is an IR detector comprising a polycrystalline Group III-V compound semiconductor detector element layer, the temperature range is about 150° C. to about 180° C., the plasma comprises hydrogen gas mixed with a noble gas as the carrier gas in gas ratio within the range of about 0.1:10 hydrogen to noble gas to about 1.0:10 hydrogen to noble gas, and wherein pulsing a plasma comprises using a pulse duration within a range of about 7 seconds to about 15 seconds and a rest time within a range of about 2 seconds to about 10 seconds between pulses for the period of time within the range of about 15 minutes to about 120 minutes, the polycrystalline IR detector after passivating grain boundaries has a dark current density characteristic that is lower than the polycrystalline IR detector before passivating the grain boundaries.

\* \* \* \* \*